(12) United States Patent
Kim et al.

(10) Patent No.: US 9,876,197 B2
(45) Date of Patent: Jan. 23, 2018

(54) DISPLAY DEVICE INCLUDING FRESNEL LENS

(71) Applicant: Samsung Display Co., Ltd., Yongin-si (KR)

(72) Inventors: Il-Joo Kim, Hwaseong-si (KR); Hee Rim Song, Seoul (KR); Mu Kyung Jeon, Ulsan (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 15/133,721

(22) Filed: Apr. 20, 2016

(65) Prior Publication Data
US 2017/0133637 A1    May 11, 2017

(30) Foreign Application Priority Data

Nov. 11, 2015  (KR) ........................ 10-2015-0158254

(51) Int. Cl.
| | | |
|---|---|---|
| *H01L 51/50* | (2006.01) | |
| *G02B 3/08* | (2006.01) | |
| *H01L 51/52* | (2006.01) | |
| *G02B 3/00* | (2006.01) | |
| *G02B 19/00* | (2006.01) | |
| *H01L 27/32* | (2006.01) | |
| *H01L 29/786* | (2006.01) | |
| *H01L 29/167* | (2006.01) | |

(52) U.S. Cl.
CPC ........ *H01L 51/5275* (2013.01); *G02B 3/0056* (2013.01); *G02B 3/0087* (2013.01); *G02B 3/08* (2013.01); *G02B 19/0014* (2013.01); *G02B 19/0066* (2013.01); *H01L 27/3246* (2013.01); *H01L 27/3248* (2013.01); *H01L 27/3258* (2013.01); *H01L 27/3262* (2013.01); *H01L 27/3265* (2013.01); *H01L 27/3276* (2013.01); *H01L 29/167* (2013.01); *H01L 29/78675* (2013.01); *H01L 51/5206* (2013.01)

(58) Field of Classification Search
CPC ..... H01L 51/5275; G02B 3/0087; G02B 3/08; B29D 11/00269
See application file for complete search history.

(56) References Cited

U.S. PATENT DOCUMENTS

| | | | |
|---|---|---|---|
| 5,486,951 A * | 1/1996 | Hamblen | ............ B29C 35/0888 |
| | | | 264/1.32 |
| 8,618,730 B2 | 12/2013 | Park et al. | |
| 9,075,242 B2 | 7/2015 | Jeong et al. | |

(Continued)

FOREIGN PATENT DOCUMENTS

| | | |
|---|---|---|
| KR | 10-2000-0059361 | 10/2000 |
| KR | 10-2011-0104701 | 9/2011 |

(Continued)

*Primary Examiner* — Karabi Guharay
(74) *Attorney, Agent, or Firm* — H.C. Park & Associates, PLC

(57) ABSTRACT

A display device including pixels disposed on a substrate, and a lens layer disposed on the substrate, the lens layer including Fresnel lenses respectively corresponding to the pixels. Each of the Fresnel lenses includes Fresnel zones disposed adjacent to each other in a radial direction with respect to a center of a corresponding Fresnel lens, and refractive indices of each of the Fresnel zones change stepwise along the radial direction.

15 Claims, 10 Drawing Sheets

(56) References Cited

U.S. PATENT DOCUMENTS

2013/0063022 A1\* 3/2013 Park ................... H01L 51/5275
  313/504
2015/0084026 A1 3/2015 Miyamoto et al.

FOREIGN PATENT DOCUMENTS

| KR | 10-2013-0107920 | 10/2013 |
| KR | 10-2014-0045292 | 4/2014 |

\* cited by examiner ative embodiments of the inventive concept,
DISPLAY DEVICE INCLUDING FRESNEL LENS

CROSS-REFERENCE TO RELATED APPLICATION

This application claims priority from and the benefit of Korean Patent Application No. 10-2015-0158254, filed on Nov. 11, 2015, which is hereby incorporated by reference for all purposes as if fully set forth herein.

BACKGROUND

Field

Exemplary embodiments relate to a display device. More particularly, exemplary embodiments relate to a display device including a Fresnel lens.

Discussion of the Background

A display device may include a liquid crystal display (LCD), a plasma display panel (PDP), an organic light emitting diode (OLED) display, a field effect display (FED), an electrophoretic display device, and the like.

An OLED display includes two electrodes and an organic emission layer disposed therebetween. An electron injected from one electrode and a hole injected from the other electrode may be recombined in the organic emission layer to generate an exciton, and the exciton may emit energy to emit light.

An OLED display has a self-luminance characteristic, and thus, may not require a separate light source. As such, a thickness and weight of an OLED display may be reduced. Further, since an OLED display has high-grade characteristics, such as low power consumption, high luminance, and high response speed, the OLED display receives attention as a next-generation display device.

However, in an OLED display, light emitted from an organic emission layer may be dispersed, such that only a portion of the light may reach the eyes of a user, which may reduce the light efficiency of the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device preventing light emitted from the emission layer from being dispersed.

Additional aspects will be set forth in the detailed description which follows, and, in part, will be apparent from the disclosure, or may be learned by practice of the inventive concept.

An exemplary embodiment discloses a display device including pixels disposed on a substrate, and a lens layer disposed on the substrate, the lens layer including Fresnel lenses respectively corresponding to the pixels. Each of the Fresnel lenses includes Fresnel zones disposed adjacent to each other in a radial direction with respect to a center of a corresponding Fresnel lens, and refractive indices of each of the Fresnel zones change stepwise along the radial direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
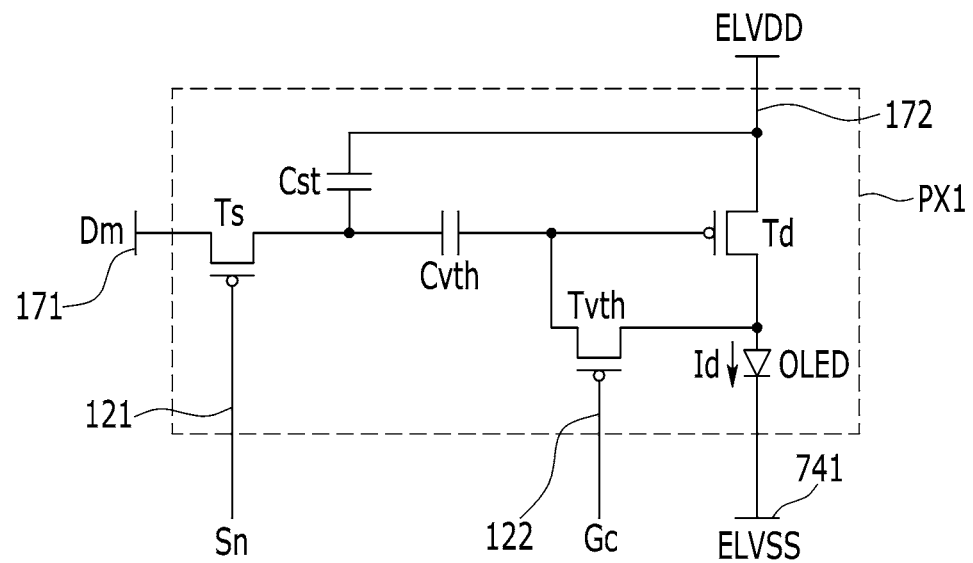
FIG. 1 is an equivalent circuit diagram of one pixel of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter a display device according to an exemplary embodiment will be described with reference to FIG. 1 to FIG. 3.

Figure 2:
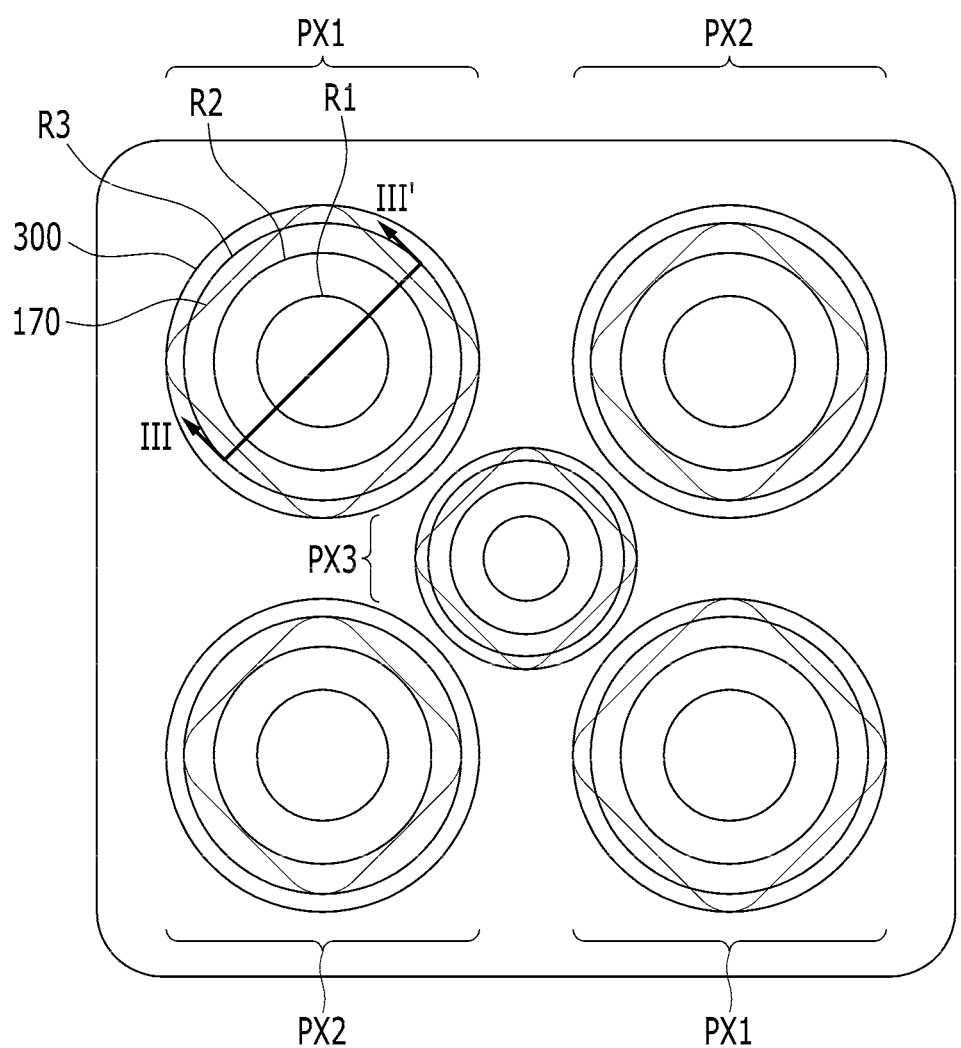
FIG. 2 is a layout view of a pixel of a display device according to an exemplary embodiment.
Figure 3:
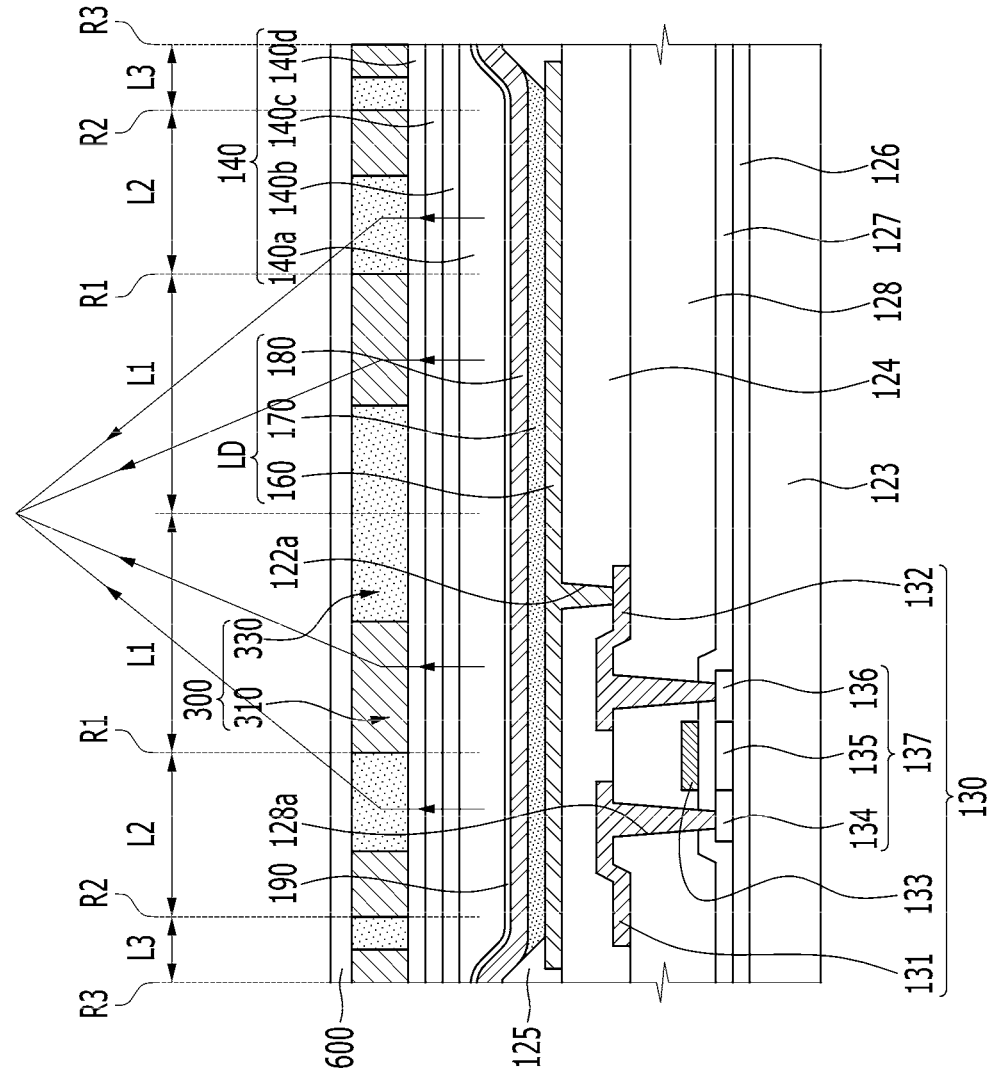
FIG. 3 is a cross-sectional view taken along line of the display device of FIG. 2.

Referring to FIG. 2 and FIG. 3, the display device according to the present exemplary embodiment may include pixels PX1, PX2, and PX3 formed on a substrate 123. In FIG. 2, a pair of pixels PX1 may be disposed to be separated from each other in a diagonal direction with respect to the pixel PX3, and a pair of pixels PX2 may be disposed to be separated from each other in a diagonal direction with respect to the pixel PX3.

The pixel PX1 may be a red pixel, the pixel PX2 may be a blue pixel, and the pixel PX3 may be a green pixel. It is noted that, however, the arrangement of the pixels PX1, PX2, and PX3 may be varied. The pixels PX1, PX2, and PX3 may be an organic light emitting element LD, a liquid crystal display element, an electrophoretic display element, and the like. Hereinafter, for convenience of description, the pixels PX1, PX2, and PX3 will be described as the organic light emitting element LD.

According to the present exemplary embodiment, a lens layer, including Fresnel lenses 300, may be disposed on the pixels PX1, PX2, and PX3. In this case, one Fresnel lens 300 may be respectively disposed on the pixels PX1, PX2, and PX3.

The Fresnel lens 300 may be a lens that utilizes diffraction of light, rather than refraction of light, by using concentric circles R1, R2, and R3, in which Fresnel zones L1, L2, and L3 are radially arranged and intervals therebetween are narrowed toward a radial direction extending away from a center thereof. The Fresnel lens 300 may collect light at a predetermined focal distance by diffracting light emitted from an organic emission layer 170. Alternatively, the Fresnel lens 300 may control the width of the Fresnel zone, or a material forming the Fresnel zone, to disperse the emitted light.

Figure 4:
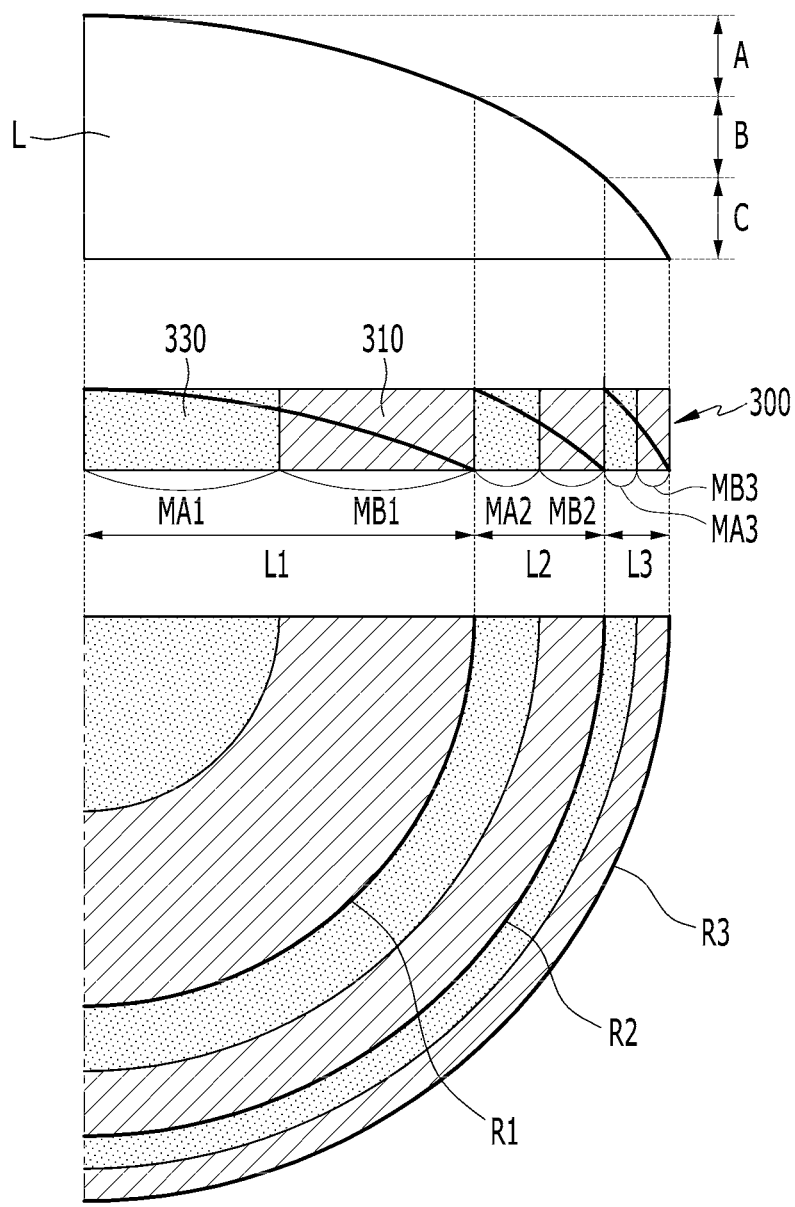
FIG. 4 is a detailed view of a lens layer of a display device according to an exemplary embodiment.

In the present exemplary embodiment shown in FIG. 3 and FIG. 4, Fresnel zones L1, L2, and L3 formed in the Fresnel lens 300 have refractive indices that change by a predetermined amount (or by step) along the radial direction away from the center of the Fresnel lens 300. For example, in the Fresnel zone L1, a first transmission layer 330 and a second transmission layer 310 having different transmittances from each other are disposed to contact each other. In this manner, the refractive index in the Fresnel zone L1 changes stepwise in the radial direction, which will be described in detail below.

Hereinafter, the principle of operation of one pixel of the organic light emitting diode display will be described with reference to FIG. 1.

FIG. 1 is an equivalent circuit diagram of one pixel of a display device according to an exemplary embodiment.

Referring to FIG. 1, one pixel PX1 of the display device according to the present exemplary embodiment includes signal lines 121, 122, 171, and 172, transistors Td, Ts, and Tvth connected to the signal lines 121, 122, 171, and 172, capacitors Cst and Cvth, and an organic light emitting diode (OLED).

The transistors Td, Ts, and Tvth include a driving transistor Td, a switching transistor Ts, and a compensation transistor Tvth. The capacitors Cst and Cvth include a storage capacitor Cst and a compensation capacitor Cvth.

The signal lines 121, 122, 171, and 172 include a scan line 121 for transmitting a signal Sn, a compensation control line 122 for transmitting a compensation control signal Gc to the compensation transistor Tvth, a data line 171 crossing the scan line 121 and transmitting a data voltage Dm, and a driving voltage line 172 for transmitting a driving voltage ELVDD to the driving transistor Td.

The driving transistor Td includes a gate electrode connected to one terminal of the compensation capacitor Cvth, a source electrode connected to the driving voltage line 172, and a drain electrode electrically connected to an anode of the OLED.

The compensation transistor Tvth includes a gate electrode connected to the compensation control line 122, a source electrode connected to the drain electrode of the driving transistor Td and the anode of the OLED, and a drain electrode connected to one terminal of the compensation capacitor Cvth and the gate electrode of the driving transistor Td.

The compensation transistor Tvth is turned on depending on the compensation control signal Gc transmitted through the compensation control line 122, such that the gate electrode and the drain electrode of the driving transistor Td are connected to each other, thereby diode-connecting the driving transistor Td.

A voltage corresponding to a threshold voltage of the driving thin film transistor Td is provided to the compensation capacitor Cvth, when the driving transistor Td is diode connected.

The gate electrode of the switching thin film transistor Ts is connected to the scan line 121, the source electrode of the switching thin film transistor Ts is connected to the data line 171, and the drain electrode of the switching thin film transistor Ts is connected to the other terminal of the storage capacitor Cst and the other terminal of the compensation capacitor Cvth. The switching thin film transistor Ts is turned on depending on the scan signal Sn transmitted through the scan line 121.

One terminal of the storage capacitor Cst is connected to the driving voltage line 172, and a gate-source voltage of the driving transistor Td is determined, depending on the provided voltage in the compensation capacitor Cvth and the storage capacitor Cst. The cathode of the OLED is connected to a common voltage line 741 transmitting a common voltage ELVSS.

The OLED emits light depending on a driving current Id transmitted through the driving transistor Td from the driving voltage line 172, and the driving current Id flows into the common voltage line 741. FIG. 1 illustrates a pixel PX having a 3-transistor and 2-capacitor structure, however, the number of transistors and capacitors may be varied.

Hereinafter, a display device according to an exemplary embodiment will be described with reference to FIG. 3.

The substrate 123 may include an inorganic material such as glass, a metal material, or an organic material, such as a resin. The substrate 123 may transmit or block light, and may be flexible.

A substrate buffer layer 126 is formed on the substrate 123. The substrate buffer layer 126 may prevent penetration of impurities and planarize the surface. The substrate buffer layer 126 may include various materials, such as silicon nitride ($SiN_x$), silicon oxide ($SiO_x$), and silicon oxynitride ($SiO_xN_y$). Alternatively, the substrate buffer layer 126 may be omitted according to a kind of the substrate 123 and a process condition thereof.

A driving semiconductor layer 137 is formed on the substrate buffer layer 126. The driving semiconductor layer 137 is formed as a polysilicon layer. Further, the driving semiconductor layer 137 includes a channel region 135 not doped with impurities, and a source region 134 and a drain region 136, in which the impurities are doped at respective sides of the channel region 135. In this case, the doped ion materials may be P-type impurities, such as boron (B) and diborane ($B_2H_6$), may be used. The impurities may vary according to a type of thin film transistor.

A gate insulating layer 127 including $SiN_x$ or $SiO_x$ is formed on the driving semiconductor layer 137. A gate line including a driving gate electrode 133 is formed on the gate insulating layer 127. The driving gate electrode 133 is formed to overlap at least a part of the driving semiconductor layer 137, more particularly, the channel region 135.

An interlayer insulating layer 128 covering the driving gate electrode 133 is formed on the gate insulating layer 127. Contact holes 128a exposing the source region 134 and the drain region 136 of the driving semiconductor layer 137 are formed in the gate insulating layer 127 and the interlayer insulating layer 128. The interlayer insulating layer 128 may include a ceramic-based material, such as $SiN_x$ or $SiO_x$.

A data line including a driving source electrode 131 and a driving drain electrode 132 is formed on the interlayer insulating layer 128. The driving source electrode 131 and the driving drain electrode 132 are connected with the source region 134 and the drain region 136 of the driving semiconductor layer 137 through the contact holes 128a formed in the interlayer insulating layer 128 and the gate insulating layer 127. In this manner, a driving thin film transistor 130 including the driving semiconductor layer 137, the driving gate electrode 133, the driving source electrode 131, and the driving drain electrode 132 is formed. The configuration of the driving thin film transistor 130 may be alternatively varied.

A planarization layer 124 covering the data wire is formed on the interlayer insulating layer 128. The planarization layer 124 may remove a step and planarize a surface thereof, in order to increase emission efficiency of the organic light emitting element LD to be formed thereon. The planarization layer 124 includes a via hole 122a exposing a part of the drain electrode 132.

The planarization layer 124 may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). According to an exemplary embodiment, one of the planarization layer 124 and the interlayer insulating layer 128 may be omitted.

A first electrode of the organic light emitting element LD, which may be a pixel electrode 160, is formed on the planarization layer 124. More particularly, each pixel of the organic light emitting diode display includes pixel electrodes 160. In this case, the pixel electrodes 160 are spaced apart from each other. The pixel electrode 160 is connected to the drain electrode 132 through the electrode via hole 122a of the planarization layer 124.

The pixel electrode 160 may include a transparent conductive material, such as indium tin oxide (ITO), indium zinc oxide (IZO), zinc oxide (ZnO), or indium oxide ($In_2O_3$) or a reflective metal, such as lithium (Li), calcium (Ca), lithium fluoride/calcium (LiF/Ca), lithium fluoride/aluminum (LiF/Al), aluminum (Al), silver (Ag), magnesium (Mg), or gold (Au).

A pixel defining layer 125 including an opening, in which an organic emission layer 170 may be disposed, is formed on the planarization layer 124. The pixel defining layer 125 may define a pixel area in which the organic emission layer 170 is disposed. In this case, the pixel electrode 160 is disposed to correspond to the opening of the pixel defining layer 125. The pixel electrode 160 may be alternatively disposed below the pixel defining layer 125, so that a part of the pixel electrode 160 overlaps with the pixel defining layer 125.

The pixel defining layer 125 may include a resin, such as a polyacrylate resin and a polyimide resin, a silica-based inorganic material, or the like. The organic emission layer 170 is formed on the pixel electrode 160.

A second electrode, which may be a common electrode 180, may be formed on the organic emission layer 170. As such, the organic light emitting diode LD including the pixel electrode 160, the organic emission layer 170, and the common electrode 180 is formed. The common electrode 180 may include a transparent conductive material, such as ITO, IZO, ZnO, or $In_2O_3$, or a transflective or reflective conductive material.

An overcoat 190 covering and protecting the common electrode 180 may be formed as an organic layer on the common electrode 180. A thin film encapsulation layer 140 is formed on the overcoat 190. The thin film encapsulation layer 140 encapsulates and protects the organic light emitting element LD and a driving circuit part formed on the substrate 123 from the external environment.

The thin film encapsulation layer 140 includes organic encapsulation layers 140a and 140c and inorganic encapsulation layers 140b and 140d, which are alternately laminated. For example, as illustrated in FIG. 3, two organic encapsulation layers 140a and 140c and two inorganic encapsulation layers 140b and 140d are alternately disposed to configure the thin film encapsulation layer 140.

According to the present exemplary embodiment, a lens layer including Fresnel lenses 300 is disposed on the thin film encapsulation layer 140. As described above, the Fresnel lens 300 may be disposed on each of the pixels PX1, PX2, and PX3. As shown in FIG. 3, the Fresnel lens 300 is disposed on the organic emission layer 170 of the pixel PX1.

Referring to FIG. 3 and FIG. 4, the Fresnel lens 300 includes Fresnel zones L1, L2, and L3. The Fresnel zones L1, L2, and L3 may be disposed to be adjacent to each other in the radial direction with respect to the center of the Fresnel lens 300. The Fresnel zone L1 may be a region forming a circle with a constant radius from the center, the Fresnel zone L2 may be a region separated from the Fresnel zone L1 by a constant distance, and the Fresnel zone L3 may be a region separated from the Fresnel zone L2 by a constant distance. Accordingly, the Fresnel zones L1, L2, and L3 may form concentric circles R1, R2, and R3.

Referring to FIG. 4, the widths of the Fresnel zones L1, L2, and L3 decrease along the radial direction away from the center of the Fresnel lens 300. More particularly, the width is decreased in the order of the Fresnel zone L1, the Fresnel zone L2, and the Fresnel zone L3. The width of each Fresnel zones L1, L2, and L3 represents the size of the region of the corresponding Fresnel zone in the radial direction from the center of the Fresnel lens.

A lens "L" illustrated in FIG. 4 represents a general convex lens. The Fresnel lens 300 may have a flat lens shape. However, a function thereof may be substantially similar to that of a convex lens. The lens "L" is divided into sections A, B, and C having the same height, and the functions of the sections A, B, and C of the lens "L" may be performed at the Fresnel zones L1, L2, and L3 of the Fresnel lens 300, respectively. In this case, the Fresnel zones L1, L2, and L3 have different widths from each other, and the refractive indices thereof changes stepwise, such that the Fresnel lens 300 may perform the substantially similar function as the lens "L" of a convex lens.

The Fresnel zones L1, L2, and L3 may include sub-zones MA1, MB1, MA2, MB2, MA3, and MB3 having different refractive indices. For example, the Fresnel zone L1 includes two sub-zones MA1 and MB1, the Fresnel zone L2 includes two sub-zones MA2 and MB2, and the Fresnel zone L3 includes two sub-zones MA3 and MB3. Here, the sub-zones MA1, MA2, and MA3 have the same refractive index, and the sub-zones MB1, MB2, and MB3 have the same refractive index. However, the refractive indices of the sub-zones MA1, MA2, and MA3 and the sub-zones MB1, MB2, and MB3 may be different from each other.

The widths of the sub-zones MA1, MB1, MA2, MB2, MA3, and MB3 included in the Fresnel zones L1, L2, and L3 are different from each other. More particularly, the widths of the sub-zone MA1 and the sub-zone MB1 included in the Fresnel zone L1 are different from each other. The widths of the sub-zone MA2 and the sub-zone MB2 included in the Fresnel zone L2 are different from each other. Also, the widths of the sub-zone MA3 and the sub-zone MB3 included in the Fresnel zone L3 are different from each other.

The widths of the sub-zones MA1, MB1, MA2, MB2, MA3, and MB3 included in the Fresnel zones L1, L2, and L3 may be decreased along the radial direction away from the center of the Fresnel lens 300. More particularly, the width of the sub-zone MA1 included in the Fresnel zone L1 is greater than the width of the sub-zone MB1. The width of the sub-zone MA2 included in the Fresnel zone L2 is greater than the width of the sub-zone MB2. The width of the sub-zone MA3 included in the Fresnel zone L3 is greater than the width of the sub-zone MB3.

Referring to FIG. 3 and FIG. 4, the sub-zones MA1, MA2, and MA3 may include a first transmission layer 330 having a first refractive index, and the sub-zones MB1, MB2, and MB3 may include a second transmission layer 310 having a second refractive index. In this manner, in the Fresnel zones L1, L2, and L3, the refractive indices thereof change stepwise along the radial direction of the Fresnel lens 300.

Figure 10:
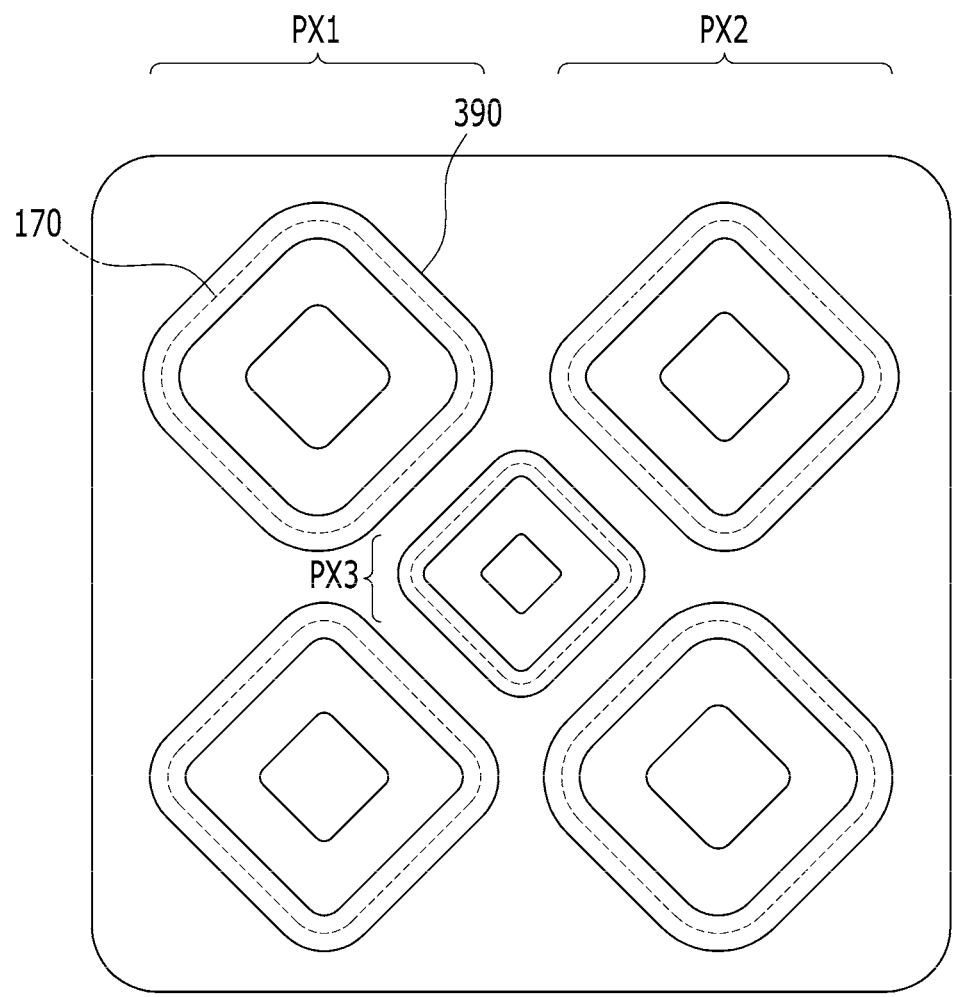
FIG. 10 is a layout view of a unit pixel of a display device according to an exemplary embodiment.

The Fresnel zone L1 may have a circular shape, in which the second transmission layer 310 encloses the first transmission layer 330 having the circular shape. In the Fresnel zone L2, the first transmission layer 330 and the second transmission layer 310 disposed therein sequentially enclose the Fresnel zone L1. In the Fresnel zone L3, the first transmission layer 330 and the second transmission layer 310 disposed therein sequentially enclose the Fresnel zone L2. In thin manner, the Fresnel lens 300 may have a flat circular shape. In is noted that, however, a Fresnel lens 390 may alternatively have a flat rectangular shape, as illustrated in FIG. 10.

The Fresnel lens 300 may be disposed to overlap the organic emission layer 170. Accordingly, light emitted from the organic emission layer 170 may pass through the Fresnel lens 300. In this case, the area of the Fresnel lens 300 may be wider than the area of the organic emission layer 170.

A window 600 may be disposed on the Fresnel lens 300. The window 600 is disposed on the uppermost part of the display device, and may prevent the organic light emitting element LD from being damaged by an external impact and prevent moisture or oxygen from penetrating into the organic light emitting element LD. In the present exemplary embodiment, the Fresnel lens 300 is disposed under and contacts the window 600. It is noted that, however, the Fresnel lens 300 may alternatively be disposed at an arbitrary position between the window 600 and the organic light emitting element LD.

When the Fresnel lens 300 is disposed on the organic emission layer 170, light emitted from the organic emission layer 170 may not be dispersed and collected at a predetermined focal distance. In this manner, the light collecting capacity of the display device may be increased, thereby increasing the photo-efficiency of the display device.

Figure 5:
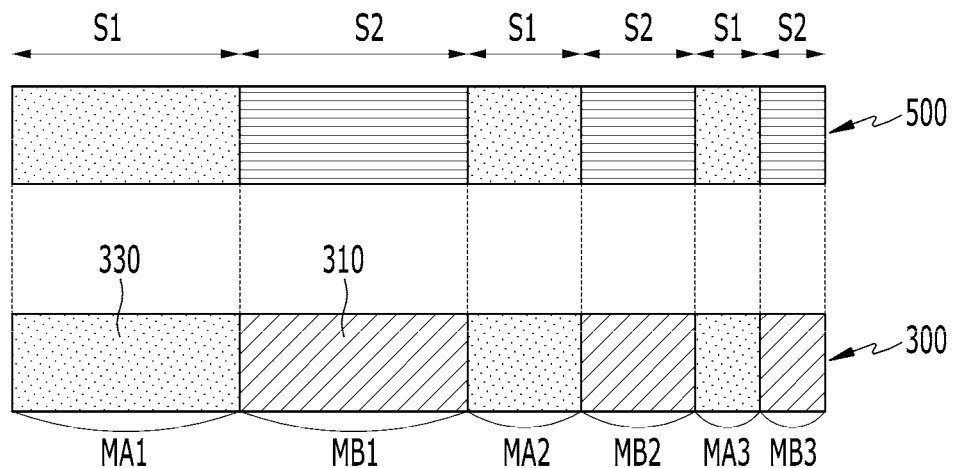
FIG. 5 is a view showing a process forming the lens layer of FIG. 4 by using a first photomask.

Referring to FIG. 5, the Fresnel lens 300 may be formed by using a first photomask 500 including a first transmission pattern S1 and a second transmission pattern S2 having different light transmittances from each other. The first transmission pattern S1 and the second transmission pattern S2 may respectively correspond to the sub-zones MA1, MB1, MA2, MB2, MA3, and MB3 in the Fresnel zones L1, L2, and L3. For example, the light transmittance of the first transmission pattern S1 may be 0%, and the light transmittance of the second transmission pattern S2 may be 100%.

According to the present exemplary embodiment, a first transmission material forming the first transmission layer 330 is coated on a surface. A photolithography process is performed on the entire coated surface by using the first photomask 500. The first photomask 500 may have a pattern, such that the first transmission material remains in the first transmission patterns S1 and the first transmission material is removed in the second transmission patterns S2, upon the photolithography process. Next, a second transmission material forming the second transmission layer 310 is coated on portions of the surface corresponding to the second transmission patterns S2. In this manner, the Fresnel lens 300 shown in FIG. 5 may be formed.

Hereinafter, a lens layer of the display device according to an exemplary embodiment will be described with reference to FIG. 6 and FIG. 7. Constituent elements of the lens layer of FIGS. 6 and 7 may be substantially similar to those of the lens layer illustrated with reference to FIGS. 3 and 4, and thus, repeated description thereof will be omitted.

Figure 6:
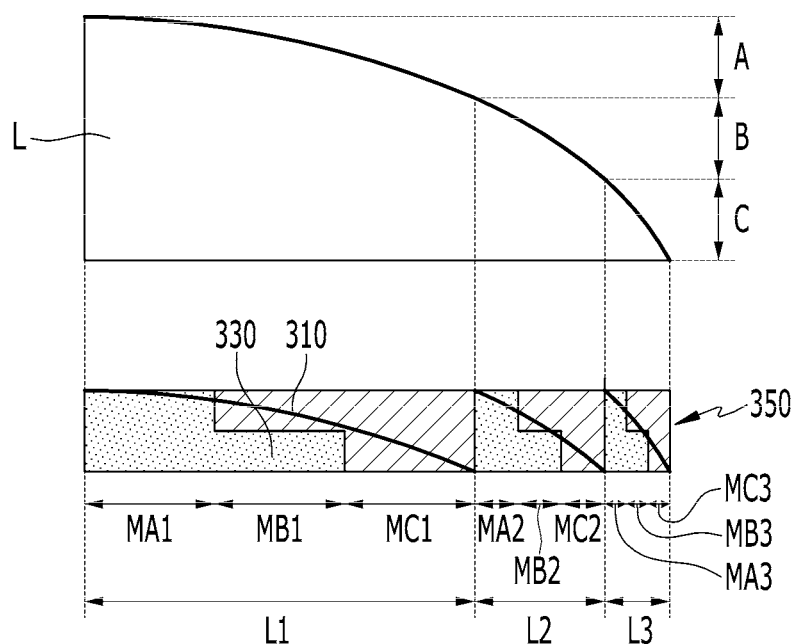
FIG. 6 is a view showing a lens layer of a display device according to an exemplary embodiment.

Referring to FIG. 6, the Fresnel zones L1, L2, and L3 may include sub-zones MA1, MB1, MC1, MA2, MB2, MC2, MA3, MB3, and MC3 having different refractive indices. For example, the Fresnel zone L1 includes three sub-zones MA1, MB1, and MC1, the Fresnel zone L2 includes three sub-zones MA2, MB2, and MC2, and the Fresnel zone L3 includes three sub-zones MA3, MB3, and MC3. The sub-zones MA1, MA2, and MA3 may have the same refractive index, the sub-zones MB1, MB2, and MB3 may have the same refractive index, and the sub-zones MC1, MC2, and MC3 may have the same refractive index. The sub-zones MA1, MA2, and MA3, the sub-zones MB1, MB2, and MB3, and the sub-zones MC1, MC2, and MC3 may have different refractive indices from each other.

The widths of the sub-zones MA1, MB1, MC1, MA2, MB2, MC2, MA3, MB3, and MC3 included in the Fresnel zones L1, L2, and L3 are different from each other. More particularly, the widths of the sub-zone MA1, the sub-zone MB1, and the sub-zone MC1 included in the Fresnel zone L1 are different from each other. The widths of the sub-zone MA2, the sub-zone MB2, and the sub-zone MC2 included in the Fresnel zone L2 are different from each other. The widths of the sub-zone MA3, the sub-zone MB3, and the sub-zone MC3 included in the Fresnel zone L3 are different from each other.

The widths of the sub-zones MA1, MB1, MC1, MA2, MB2, MC2, MA3, MB3, and MC3 included in the Fresnel zones L1, L2, and L3 gradually decrease in the radial direction away from the center of a Fresnel lens 350. That is, in the Fresnel zone L1, the widths are decreased in order of the sub-zone MA1, the sub-zone MB1, and the sub-zone MC1. In the Fresnel zone L2, the widths are decreased in order of the sub-zone MA2, the sub-zone MB2, and the sub-zone MC2. In the Fresnel zone L3, the widths are decreased in order of the sub-zone MA3, the sub-zone MB3, and the sub-zone MC3.

In the present exemplary embodiment, the sub-zones MA1, MA2, and MA3 may include the first transmission layer 330 having the first refractive index, and the sub-zones MC1, MC2, and MC3 may include the second transmission layer 310 having the second refractive index. The sub-zones MB1, MB2, and MB3 may include the first transmission layer 330 and the second transmission layer 310 with the same thickness.

Accordingly, the sub-zones MA1, MA2, and MA3, the sub-zones MB1, MB2, and MB3, and the sub-zone MC1, MC2, and MC3 have different refractive indices from each other. More particularly, in the Fresnel zones L1, L2, and L3, refractive indices thereof change stepwise along the radial direction away of the Fresnel lens 350. In the Fresnel zones L1, L2, and L3 illustrated with reference to FIG. 4, two sub-zones having two different refractive indices are disposed in at least one of the Fresnel zones L1, L2, and L3. In the present exemplary embodiment, three sub-zones having different refractive indices may be disposed in at least one of the Fresnel zones L1, L2, and L3. As described above, as the number of the sub-zones having different refractive indices increases in one of the Fresnel zones L1, L2, and L3, the Fresnel lens 350 may function similarly to a convex lens.

Figure 7:
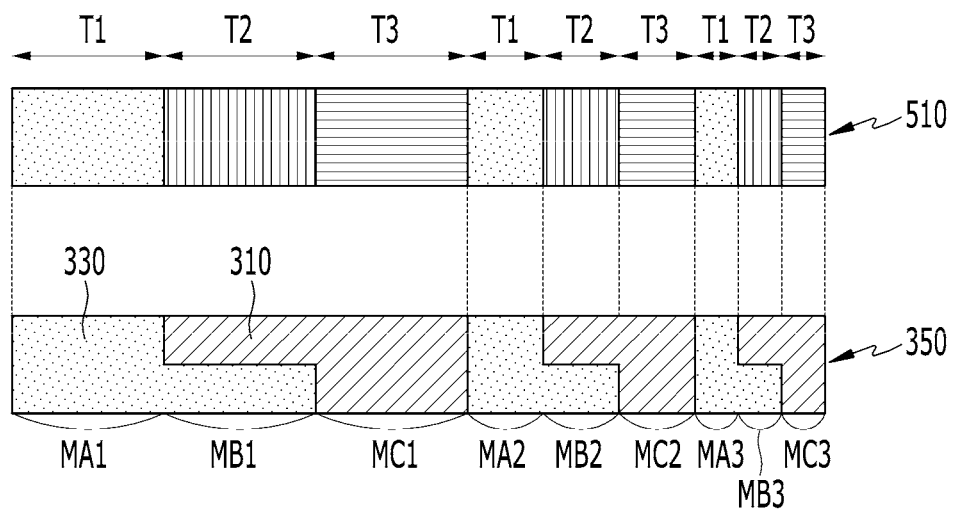
FIG. 7 is a view showing a process of forming the lens layer of FIG. 6 by using a second photomask.

Referring to FIG. 7, the Fresnel lens 350 may be formed by using a second photomask 510 including a first transmission pattern T1, a second transmission pattern T2, and a third transmission pattern T3 having different light transmittances from each other. In this case, the first transmission pattern T1, the second transmission pattern T2, and the third transmission pattern T3 may respectively correspond to the sub-zones MA1, MB1, MC1, MA2, MB2, MC2, MA3, MB3, and MC3 of the Fresnel zones L1, L2, and L3. For example, the first transmission pattern T1 may have light transmittance of 0%, the second transmission pattern T2 may have light transmittance of 50%, and the third transmission pattern T3 may have light transmittance of 100%.

The Fresnel lens 350 according to the present exemplary embodiment may be formed by coating the first transmission material forming the first transmission layer 330 on an entire surface. A photolithography process may be performed on the coated surface using the second photomask 510. The second photomask 510 may have a pattern, such that the first transmission material remains in the first transmission patterns T1, a portion of the first transmission material remains in the second transmission patterns T2, and the first transmission material is removed in the third transmission patterns T3, upon the photolithography process. Next, the second transmission material forming the second transmission layer 310 is coated on portions of the surface corresponding to the second and third transmission patterns T2 and T3. In this manner, the pattern of the Fresnel lens 350 shown in FIG. 7 may be formed.

Hereinafter, a lens layer of the display device according to an exemplary embodiment will be described with reference to FIG. 8 and FIG. 9. Constituent elements of the lens layer of FIGS. 8 and 9 may be substantially similar to those of the lens layer illustrated with reference to FIGS. 3 and 4, and thus, repeated description thereof will be omitted.

Figure 8:
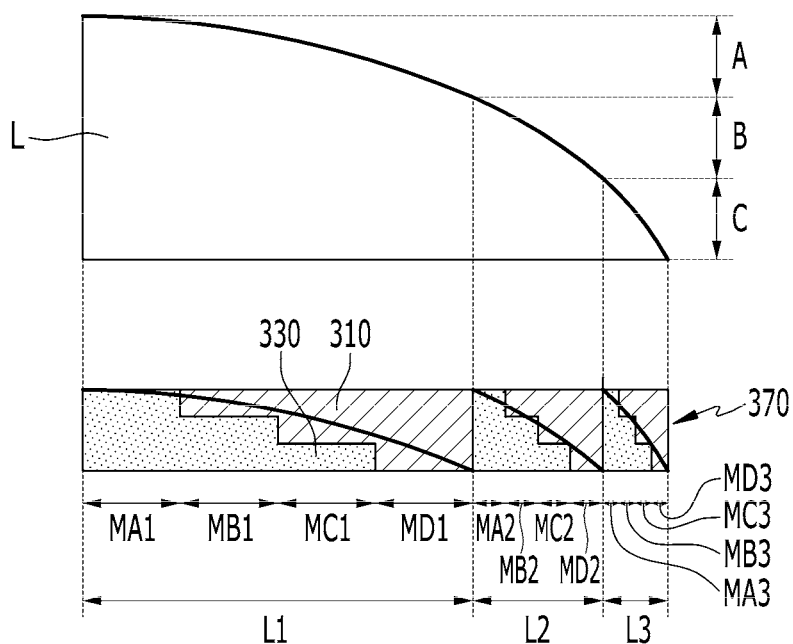
FIG. 8 is a view showing a lens layer of a display device according to an exemplary embodiment.

Referring to FIG. 8, the Fresnel zones L1, L2, and L3 may include sub-zones MA1, MB1, MC1, MD1, MA2, MB2, MC2, MD2, MA3, MB3, MC3, and MD3 having different refractive indices. For example, the Fresnel zone L1 includes four sub-zones MA1, MB1, MC1, and MD1, the Fresnel zone L2 includes four sub-zones MA2, MB2, MC2, and MD2, and the Fresnel zone L3 includes four sub-zones MA3, MB3, MC3, and MD3.

The sub-zones MA1, MA2, and MA3 have the same refractive index, and the sub-zones MB1, MB2, and MB3 have the same refractive index. The sub-zones MC1, MC2, and MC3 have the same refractive index, and the sub-zones MD1, MD2, and MD3 have the same refractive index. The sub-zones MA1, MA2, and MA3, the sub-zones MB1, MB2, and MB3, the sub-zones MC1, MC2, and MC3, and the sub-zones MD1, MD2, and MD3 have refractive indices different from each other.

The widths of the sub-zones MA1, MB1, MC1, MD1, MA2, MB2, MC2, MD2, MA3, MB3, MC3, and MD3 included in the Fresnel zones L1, L2, and L3 are different from each other. More particularly, the widths of the sub-zone MA1, the sub-zone MB1, the sub-zone MC1, and the sub-zone MD1 included in the Fresnel zone L1 are different from each other. The widths of the sub-zone MA2, the sub-zone MB2, the sub-zone MC2, and the sub-zone MD2 included in the Fresnel zone L2 are different from each other. The widths of the sub-zone MA3, the sub-zone MB3, the sub-zone MC3, and the sub-zone MD3 included in the Fresnel zone L3 are different from each other.

The widths of the sub-zones MA1, MB1, MC1, MD1, MA2, MB2, MC2, MD2, MA3, MB3, MC3, and MD3 included in the Fresnel zones L1, L2, and L3 may decrease toward the radial direction away from the center of the Fresnel lens 370. More particularly, in the Fresnel zone L1, the width is decreased in order of the sub-zone MA1, the sub-zone MB1, the sub-zone MC1, and the sub-zone MD1. In the Fresnel zone L2, the width is decreased in order of the sub-zone MA2, the sub-zone MB2, the sub-zone MC2, and the sub-zone MD2. In the Fresnel zone L3, the width is decreased in order of the sub-zone MA3, the sub-zone MB3, the sub-zone MC3, and the sub-zone MD3.

In the present exemplary embodiment, the sub-zones MA1, MA2, and MA3 include the first transmission layer 330 having the first refractive index, and the sub-zones MD1, MD2, and MD3 may include the second transmission layer 310 having the second refractive index.

The sub-zones MB1, MB2, and MB3 may include the first transmission layer 330 and the second transmission layer 310 with different thicknesses. In this case, in the sub-zones MB1, MB2, and MB3, the thickness of the first transmission layer 330 is greater than that of the second transmission layer 310. For example, the thickness of the first transmission layer 330 may be double than that of the second transmission layer 310.

The sub-zone MC1, MC2, and MC3 may include the first transmission layer 330 and the second transmission layer 310 with different thicknesses. In the sub-zones MC1, MC2, and MC3, however, the thickness of the second transmission layer 310 may be greater than the first transmission layer 330. For example, the thickness of the second transmission layer 310 may be double than that of the first transmission layer 330.

Accordingly, the sub-zones MA1, MA2, and MA3, the sub-zones MB1, MB2, and MB3, the sub-zones MC1, MC2, and MC3, and the sub-zones MD1, MD2, and MD3 have different refractive indices from each other. More particularly, in the Fresnel zones L1, L2, and L3, the refractive indices thereof change stepwise along the radial direction away from the center of the Fresnel lens 370. In the Fresnel lens 350 of FIG. 6, three sub-zones having three different refractive indices are disposed in at least one of the Fresnel zones L1, L2, and L3, however, in the present exemplary embodiment, four sub-zones having four different refractive indices may be disposed in at least one of the Fresnel zones L1, L2, and L3.

Figure 9:
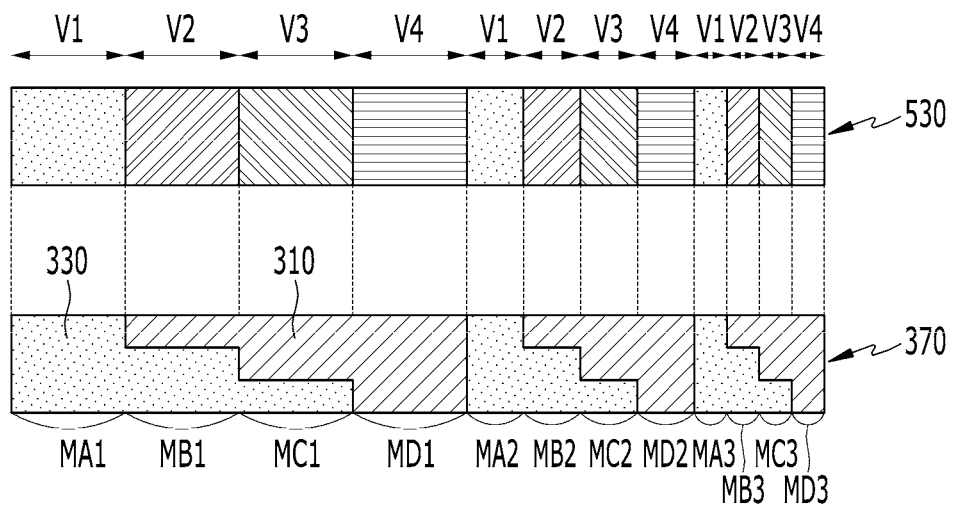
FIG. 9 is a view showing a process forming the lens layer of FIG. 8 by using a third photomask.

Referring to FIG. 9, a Fresnel lens 370 may be formed by using a third photomask 530 including a first transmission pattern V1, a second transmission pattern V2, a third transmission pattern V3, and a fourth transmission pattern V4 having different light transmittances from each other. In this case, the first transmission pattern V1, the second transmission pattern V2, the third transmission pattern V3, and the fourth transmission pattern V4 respectively correspond to the sub-zones MA1, MB1, MC1, MD1, MA2, MB2, MC2, MD2, MA3, MB3, MC3, and MD3 of the Fresnel zones L1, L2, and L3. For example, the first transmission pattern V1 may have light transmittance of 0%, the second transmission pattern V2 may have light transmittance of 30%, the third transmission pattern V3 may have light transmittance of 60%, and the fourth transmission pattern V4 may have light transmittance of 100%.

The Fresnel lens 370 according to the present exemplary embodiment may be formed by coating the first transmission material forming the first transmission layer 330 on an entire surface. A photolithography process may be performed on the coated surface using the third photomask 530. The third photomask 530 may have a pattern, such that the first transmission material remains in the first transmission patterns V1, a first portion of the first transmission material remains in the second transmission patterns V2, a second portion of the first transmission material less than the first portion remains in the third transmission patterns V3, and the first transmission material is removed in the fourth transmission patterns V4, upon the photolithography process. Next, the second transmission material forming the second transmission layer 310 is coated on portions of the surface corresponding to the second, third, and fourth third transmission patterns V2, V3, and V4. In this manner, the pattern of the Fresnel lens 370 shown in FIG. 9 may be formed.

In the display device according to exemplary embodiments of the present invention, a Fresnel lens is disposed on an organic emission layer, such that light emitted from the organic emission layer is not dispersed, and may be collected at a predetermined focal distance. Accordingly, the light collection capacity of the display device may be increased, which may increase the photo-efficiency of the display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device, comprising:
pixels disposed on a substrate; and
a lens layer disposed on the substrate, the lens layer comprising Fresnel lenses spaced apart from each other, and each Fresnel lens being disposed on one pixel of the pixels,
wherein:
each of the Fresnel lenses comprises Fresnel zones disposed adjacent to each other in a radial direction with respect to a center of a corresponding Fresnel lens;
refractive indices of each of the Fresnel zones change stepwise along the radial direction;
the pixels comprise a first pixel, a second pixel, and a third pixel; and
an area of a Fresnel lens disposed on the third pixel is smaller than an area of a Fresnel lens disposed on the first pixel or the second pixel.

2. The display device of claim 1, wherein each of the Fresnel zones comprises sub-zones having refractive indices different from each other.

3. The display device of claim 2, wherein each of the sub-zones comprises at least one of a first transmission layer and a second transmission layer having different refractive indices from each other.

4. The display device of claim 3, wherein:
at least one sub-zone of the sub-zones comprises the first transmission layer and the second transmission layer; and
the thicknesses of the first transmission layer and the second transmission layer in the at least one sub-zone are different from each other.

5. The display device of claim 4, wherein widths of the sub-zones are different from each other.

6. The display device of claim 5, wherein the widths of the sub-zones decrease along the radial direction away from the center of the corresponding Fresnel lens.

7. The display device of claim 1, wherein the widths of the Fresnel zones decrease along the radial direction away from the center of the corresponding Fresnel lens.

8. The display device of claim 1, wherein each of the Fresnel lenses have a flat circular shape.

9. The display device of claim 1, wherein each of the Fresnel lenses have a flat quadrangular shape.

10. The display device of claim 1, further comprising a window is disposed on the lens layer.

11. The display device of claim 1, wherein the pixels respectively include an organic light emitting element.

12. The display device of claim 11, wherein the organic light emitting element comprises:
- a first electrode disposed on the substrate;
- an organic emission layer disposed on the first electrode; and
- a second electrode disposed on the organic emission layer.

13. The display device of claim 12, wherein the Fresnel lenses respectively overlap the organic emission layer.

14. The display device of claim 12, wherein each area of the Fresnel lenses is greater than an area of the organic emission layer.

15. A display device, comprising:
- pixels disposed on a substrate; and
- a lens layer disposed on the substrate, the lens layer comprising Fresnel lenses respectively corresponding to the pixels, wherein:
- each of the Fresnel lenses comprises Fresnel zones disposed adjacent to each other in a radial direction with respect to a center of a corresponding Fresnel lens;
- refractive indices of each of the Fresnel zones change stepwise along the radial direction;
- each of the Fresnel zones comprises sub-zones having refractive indices different from each other;
- each of the sub-zones comprises at least one of a first transmission layer and a second transmission layer having different refractive indices from each other;
- at least one sub-zone of the sub-zones comprises the first transmission layer and the second transmission layer; and
- the thicknesses of the first transmission layer and the second transmission layer in the at least one sub-zone are substantially the same.

* * * * *